United States Patent
Yang et al.

(10) Patent No.: US 8,693,501 B2
(45) Date of Patent: Apr. 8, 2014

(54) SUBSET CODING FOR COMMUNICATION SYSTEMS

(75) Inventors: Shenghao Yang, Fanling (CN); Raymond Wai Ho Yeung, Sha Tin (CN)

(73) Assignee: The Chinese University of Hong Kong, Hong Kong (HK)

(*) Notice: Subject to any disclaimer, the term of this patent is extended or adjusted under 35 U.S.C. 154(b) by 359 days.

(21) Appl. No.: 13/112,589

(22) Filed: May 20, 2011

(65) Prior Publication Data

US 2012/0128009 A1    May 24, 2012

Related U.S. Application Data

(60) Provisional application No. 61/416,654, filed on Nov. 23, 2010.

(51) Int. Cl.
    *H04J 3/24* (2006.01)
(52) U.S. Cl.
    USPC .......................... 370/474; 370/431
(58) Field of Classification Search
    USPC .......... 370/432, 431, 436, 473, 474; 709/229, 709/231, 246
    See application file for complete search history.

(56) References Cited

U.S. PATENT DOCUMENTS

2009/0248898 A1* 10/2009 Gkantsidis et al. ........... 709/246

FOREIGN PATENT DOCUMENTS

| CN | 101044731 A | 9/2007 |
| CN | 101296056 A | 10/2008 |

OTHER PUBLICATIONS

International Search Report and Written Opinion for PCT Patent Application No. PCT/CN2011/082365, mailed on Dec. 29, 2011; 11 pages.

* cited by examiner

*Primary Examiner* — Dady Chery
(74) *Attorney, Agent, or Firm* — Kilpatrick Townsend & Stockton LLP; Kenneth R. Allen

(57) ABSTRACT

A method for data encoding and associated decoding is based on the concept of batches that allows transmission of a large data file from a source node to multiple destination nodes through communication networks that may employ network coding wherein sparse matrix codes are employed in a network setting. A batch is a set of packets generated by a subset of the input packets using sparse matrix encoder. A sparse matrix encoder can be called repeatedly to generate multiple batches. The batches are generally independent of one another. During the transmission in a communication network, network coding can be applied to packets belonging to the same batch to improve the multicast throughput. A decoder recovers all or at least a fixed fraction of the input packets using received batches. The input packets can be pre-coded using a pre-code before applying sparse matrix codes. The data file can then be reconstructed by further decoding the pre-code.

8 Claims, 12 Drawing Sheets

22
\

54
\

SUBSET CODING FOR COMMUNICATION SYSTEMS

CROSS-REFERENCES TO RELATED APPLICATIONS

The present application claims benefit under 35 USC 119 (e) of U.S. provisional Application No. 61/416,654, filed on Nov. 23, 2010, entitled "Subset Coding For Communication Systems," the content of which is incorporated herein by reference in its entirety.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This invention relates to reliable communication of large amounts of related digital data, and more particularly to reliable point-to-multipoint communication of large files of data, where a file is a collection of digital data.

There is an inherent problem of transmitting a large file of digital data from a source node over a communication network to multiple destinations with confidence that it has been received accurately. A single source node embodiment is described for illustration purposes in this document, though it is allowed to use multiple source nodes to send a single source file. The file can be an operating system update, a high-definition video, or the data collected by environmental sensors. There is a need for an efficient transmission scheme for such tasks with the consideration of the following performance metrics.

1. Encoding/decoding complexity: The order of complexity is hoped to be linear with the number of total packets.
2. Network transmission delay: To allow the scheme to support time sensitive services, small transmission delay is necessary.
3. Transmission throughput: For the multicast communication model, the scheme supports the target multicast capacity.
4. Cost at the intermediate network nodes: Both the computation and storage requirements for the intermediate nodes (nodes that participate in the transmission but do not require the file) should be minimized.
5. Transmission protocol overhead: The protocol overhead should be minimal.

The communication network can be a wireline network, a wireless network, or an overlay network built upon the combination of wireline and wireless networks. It is a prerequisite that the network transmission is packetized, i.e., all transmitted data are grouped into suitably-sized blocks, called packets. A network node can transmit packets to its neighbor nodes through wireless or wireline links. However, it is known that the network links are not perfect; as a packet can be corrupted or erased during transmission, or an intermediate node may fail during transmission. A corrupted packet can be deleted and treated as an erasure. (In this model, we consider only erasures on the network links.)

Network coding is a known network transmission technique that generally improves the network throughput and is resilient to packet loss. In particular, linear network coding is a known efficient way to achieve the network capacity of multicast. Routing is a special case of linear network coding. Instead of just routing, linear network coding allows intermediate network nodes to transmit new packets generated by linear combinations of the packets they have received. Such operations in the intermediate network nodes are referred to as recoding of network codes. However, as the size of the transfer matrix determined by the linear combination coefficients of network increases, the complexity of encoding, recoding and decoding also increases quickly.

A number of file distribution schemes using network coding are known to the art. One common feature of known schemes is to use the concept of chunk (also called class or generation) wherein a data file to be transmitted is divided into equally-sized packets, and all the packets are grouped into several chunks of equal size, which can be disjoint or overlapped. During the transmission, network coding is applied to the packets in the same chunk. These schemes have low encoding/decoding complexity if the size of the chunks is small. But they all have various drawbacks and cannot meet the requirements of the performance metrics defined above.

One problem of "chunk"-based schemes is how to schedule the transmissions of these chunks. A simple solution is to transmit the chunks one by one, where the source node keeps transmitting the coded packets of one chunk. A destination node collects packets until it can correctly decode the current chunk. Then the destination node sends a control message to the source node to indicate successful decoding. In such a scheme, however, the control message overhead can be large, and in a peer-to-peer application, the message must be sent to all the concerned network nodes. Moreover, this scheme is not scalable to multiple destinations because the transmission of a chunk does not stop until all the destinations decode the current chunk.

To resolve the issues of sequential scheduling, chunks can be scheduled in a round-robin order or randomly. However, both methods introduce new issues. First, both methods are not efficient when there are only a small fraction of chunks undecoded. Second, the intermediate nodes are required to buffer all the chunks. Precoding was considered to resolve the first issue, but this method does not work well for practical chunk sizes.

Overlapped chunks can improve the throughput of random scheduling for practical chunk sizes. Intuitively, the advantage of overlapped chunks is to use the decoded chunks to help the decoding of the other chunks. Known designs of overlapped chunks are heuristic, and the performance can only be evaluated by simulation.

A class of codes that are promising but heretofore not fully exploited are fountain codes. Fountain codes are the class of codes for transmitting messages through erasure channels with low encoding/decoding complexity. An erasure channel is a simple network with only one link. These include LT codes, a class of codes introduced by M. Luby for erasure channels with low encoding/decoding complexity, and Raptor codes, that achieve even lower encoding/decoding complexity by combining a variation of LT codes with certain pre-codes.

The encoding of LT codes involves the following procedure: First, a pre-designed degree distribution is sampled and an integer value d is obtained. Then d distinct input packets are chosen randomly and added using bitwise sum to yield the output packet. Output packets are transmitted through an erasure channel and the number of transmitted output packets can be unlimited.

An LT decoder can use any n output packets to recover the original K input packets, where n is certain number larger than K. The decoding process can be described by a decoding graph (called a Tanner graph) of the LT codes. A decoding graph is a bipartite graph with K nodes on one side and n nodes on the other side, called the variable nodes and the check nodes, which correspond to the input packets and output packets, respectively. There is an edge between an input packet and an output packet if the input packet contributes to the value of the output packet. At each step of the decoding algorithm, the decoder identifies an output packet of degree one. The value of the output packet of degree one is just the value of its unique neighbor among the input packets. Once an input packet is recovered, its value is subtracted from the values of all the neighboring output packets, and this input packet and all its related edges are removed from the graph.

The degree distribution of an LT code needs to be carefully designed so that the LT code has both a low encoding/decoding complexity and the above decoding algorithm succeeds with high probability. The LT codes proposed by M. Luby require that all the input packets are recovered by the LT decoder. Raptor codes relax this condition in a way that only a constant fraction of the input packets need to be recovered. The remaining input packets are recovered using precoding.

Fountain codes, however, are not designed for general communication networks; simply applying fountain codes in such networks may not be optimal. For the general network, applying fountain codes link by link together with network coding can achieve the maximum throughput. But such a scheme has two drawbacks: First, both decoding and recoding of LT codes are needed at each intermediate node, so the complexity is not low. Second, a decoding delay in proportion with the file size is incurred at each intermediate node, and so the end-to-end decoding delay grows with size of the network. For a network with a tree structure, the delay can be reduced by applying fountain codes in a stack manner: An intermediate node buffers the packets it receives and re-encodes using fountain codes, and a destination node decodes multiple layers of fountain codes. This method only moves all the decoding to the destination nodes.

The difficulty to apply fountain codes in networks employing linear network coding is because network coding changes the degrees of packets and results in the failure of efficient belief propagation decoding. Heuristic algorithms have been developed for special communication scenarios such that the set of coded packets received at a destination node approximates an LT code. But in general it is difficult to guarantee the degree of the received packets following a specific distribution using distributed encoding. Therefore, what is desired is a file transmission scheme that does not require excessive computation and storage at the intermediate nodes, and that can be used to efficiently distribute a file in a network employing linear network coding.

The following patents have been noted in the art: U.S. Pat. Nos. 7,068,729; 6,373,406; 6,307,487.

The following references provide background information for the present invention:

S.-Y. R. Li, R. W. Yeung, and N. Cai, "Linear network coding," *IEEE Trans. Inform. Theory*, Vol. 49, No. 2, pp. 371-381, February 2003.

P. Maymounkov, N. J. A. Harvey, and D. S. Lun, "Methods for efficient network coding," in *Proc. Allerton Conf. Comm., Control, and Computing*, September 2006.

T. Ho, B. Leong, M. Medard, R. Koetter, Y. Chang, and M. Effros, "The benefits of coding over routing in a randomized setting," in *Proc. IEEE ISIT '03*, June 2003.

D. S. Lun, M. Medard, R. Koetter, and M. Effros, "On coding for reliable communication over packet networks," Physical Communication, vol. 1, no. 1, pp. 3-20, 2008.

D. Silva, W. Zeng, and F. R. Kschischang, "Sparse network coding with overlapping classes," *CoRR*, vol. abs/ 0905.2796, 2009.

A. Heidarzadeh and A. H. Banihashemi, "Overlapped chunked network coding," *CoRR*, vol. abs/0908.3234, 2009.

R. Ahlswede, N. Cai, S.-Y. R. Li, and R. W. Yeung, "Network information flow," *IEEE Trans. Inform. Theory*, vol. 46, No. 4, pp. 1204-1216, July 2000.

R. Koetter and M. Medard, "An algebraic approach to network coding," *IEEE/ACM Trans. Networking*, vol. 11, No. 5, pp. 782-795, October 2003.

P. A. Chou, Y. Wu, and K. Jain, "Practical network coding," in *Proc. Allerton Conf. Comm, Control, and Computing*, October 2003.

M. Luby, "LT Codes," in *Proc. 43rd Ann. IEEE Symp. on Foundations of Computer Science*, November 2002, pp. 271-282.

A. Shokrollahi, "Raptor Codes," *IEEE Trans. Inform. Theory*, Vol. 52, No. 6, pp. 2551-2567, 2006.

R. Gummadi, and R. S. Sreenivas, "Relaying a fountain code across multiple nodes," in *Proc. IEEE Information Theory Workshop, 2008, ITW'08*, 2008, pp. 149-153.

M.-L. Champel, K. Huguenin, A.-M. Kermarrec, and N. L. Scouarnec, "LT network codes," Techreport, INRIA, 2009.

SUMMARY OF THE INVENTION

According to the invention, a method and system for data encoding and associated decoding are provided based on the concept of batches that allow transmission of a large data file from a source node to multiple destination nodes through communication networks that may employ network coding. In a specific embodiment, a batch contains M coded packets where M>1. (When M=1, the codes of the invention degenerate to LT/Raptor codes.) The source node generates a batch using a sparse matrix code by the following steps:

1. Obtain a degree d by sampling a degree distribution;
2. Pick d distinct input packets;
3. Generate the batch of coded packets using the current d packets and a generator matrix.

The encoder can generate one or more batches that are generally independent of each other. In a specific embodiment, the source node merely schedules the transmission of batches one by one. After transmitting M packets of a batch, the source node generates and transmits another batch.

A major feature of batches is that during the transmission of a batch in a network, various corruptions of packets and various operations at the intermediate nodes are allowed, as long as the overall end-to-end transformation of the network is given by a linear function. An example of such packet correction is packet loss or erasure. Examples of such intermediate nodes operations are routing and more generally linear network coding.

In a specific embodiment, an intermediate node recodes the received (coded) packets belonging to a common batch into new packets for the same batch, and then transmits these new packets on its outgoing links. This is the scenario in which linear network coding is employed within the network.

In a further specific embodiment, a subset coding method is provided wherein the file to be transmitted is separated into packets of equal length over a finite field with size q. A destination node according to the invention receives packets, wherein each received packet belongs to one batch. The destination node uses a decoder that decodes the received batches using a belief propagation decoding algorithm of sparse matrix codes. The decoder needs to recover at least a predefined fraction of all the input packets.

In a further specific embodiment, input packets are first encoded at a source node by a pre-code to introduce some redundancy. The pre-coded input packets are then encoded and transmitted at the source node using a sparse matrix code.

A destination node uses a decoder that decodes the received batches using a belief propagation decoding algorithm of sparse matrix codes. The decoder needs to recover a pre-defined fraction of all the (pre-coded) input packets. The original input packets are recovered from the pre-code.

Advantages of this coding and decoding technique include:
1. low encoding/decoding complexity,
2. minimal network transmission delay,
3. high transmission throughput benefiting from network coding,
4. low cost at intermediate network nodes in terms of both computation and storage, and
5. a simple transmission protocol.

This coding scheme provides a solution in a wide variety of situations. This scheme is suitable to be implemented in wireless networks. Examples of such wireless networks include wireless sensor networks and ad hoc networks of cellular phones. This method can be used in a distributed storage system, where each batch can be regarded as a storage piece of the original file. Batches can be stored in storage devices in multiple network locations. To recover the file, a certain number of batches are retrieved. This coding method can also be realized in a peer-to-peer file distribution system. It is possible to adapt this method for video/audio streaming and broadcast systems, although the specific codes herein disclosed are not specifically optimized for such systems.

By contrast, previous coding schemes for similar problems either require the intermediate network nodes to have a buffer size equal to the whole file, or to depend on heavy control messages to coordinate the transmission. In comparison, this scheme only requires a small buffer size at the intermediate nodes and minimal control messages.

The invention will be better understood by reference to the following detailed description in connection with the accompanying drawings.

DETAILED DESCRIPTION OF THE INVENTION

Figure 1:
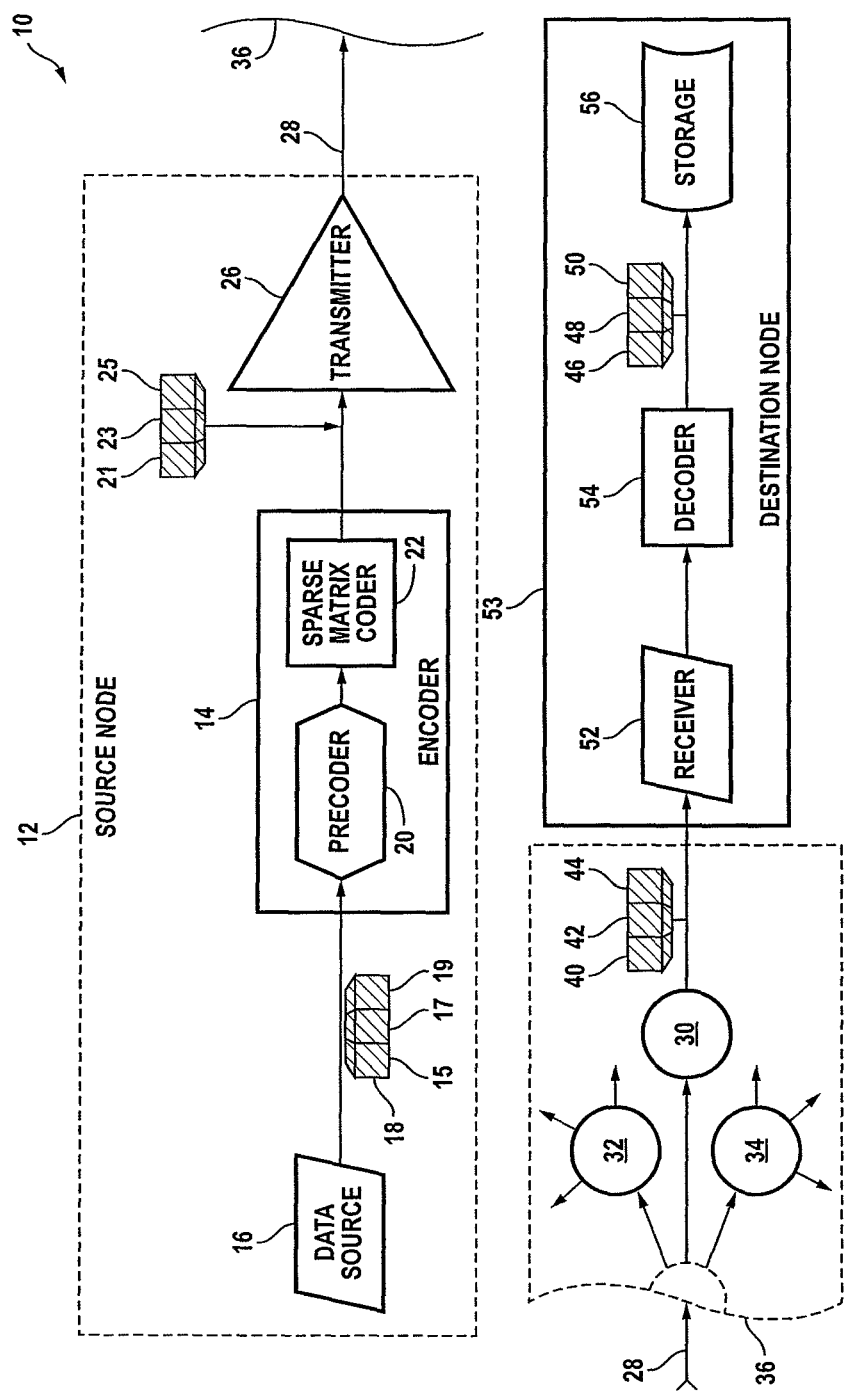
FIG. 1 is a block diagram of a system employing encoding and decoding according to the invention.

FIG. 1 is a block diagram showing elements of a communication system 10 employing the methodology according to the invention. A source node 12 comprises an encoder 14 coupled to a data source 16 that provides as input to the encoder 14 multiple large data files, for example large data file 18. The encoder 14 may include a precoder 20. In addition there is a sparse matrix coder 22. The output of the encoder 14 is coupled to a transmitter 26 which in turn is coupled to a link 28 over which batches 21, 23, 25 are transmitted. The link 28 is coupled to one or more intermediate nodes 30, 32, 34, typically within a mesh or cloud 36. The input to the encoder 14 is a sequence of source packets 15, 17, 19 corresponding to the large data file 18. The output of the encoder 14 to the transmitter 26 is a set of encoded output packets, herein autonomous batches 21, 23, 25. The transmitter 26 transmits these batches in a form that is suitable for the network. These batches are conveyed to the destination node 53 via the intermediate nodes, e.g., 30, which do not decode the file or any batches but they can apply network coding to produce the batches 40, 42, 44. From the input of the destination node 53, the receiver 52 and the decoder 54 can recover the source large data file 18 as recovered packets 46, 48, 50 that provide input to a storage unit 56 or other utilization device. The techniques for encoding and decoding according to the invention are explained herein below.

Sparse Matrix Codes

According to the invention, a method and coding scheme are proposed for the transmission of one file in the file distribution problem. The core component of this scheme is sparse matrix codes. Hence, a key component is the sparse matrix coder 22.

Generate Batches

A file consists of K disjoint packets, each of which has T symbols in a finite field F with size q. The packet length T is limited by the network protocols and can be several kilobytes. These packets are denoted as:

$$B=[b_1, b_2, \ldots, b_K]$$

where $b_i$, called an input packet, is a column vector containing T symbols from F.

A batch is a set of M coded packets generated using M possibly different linear combinations of a same subset of these input packets. A batch is denoted using the matrix formed by juxtaposing the M packets of the batch. For i=1, 2, ..., a batch $X_i$ is generated as $$X_i = B_i G_i.$$

where $G_i$ is called the generator matrix of the $i^{th}$ batch. The details about the design of $G_i$ are described below. The packet in $B_i$ are denoted the contributors of the $i^{th}$ batch.

Each batch is generated without regard to how other batches are generated. According to the invention, the formation of $B_i$ depends on a degree distribution $\Psi=(\Psi_0, \Psi_1, \ldots, \Psi_K)$ as in the LT/Raptor codes. The design of $\Psi$, however, is different from the degree distribution of LT/Raptor codes, and is discussed elsewhere herein. To generate the $i^{th}$ batch, the distribution $\Psi$ is first sampled to obtain a degree $d_i$. Then uniformly at random choose $d_i$ input packets forming $B_i$ by juxtaposing these packets.

Design of Generator Matrices

One way to design a generator matrix is to simply use the $G_i$ that is pre-designed and shared by the source node and the destinations. Another way is to randomly generate $G_i$ by the source node. It is not necessary to deliver $G_i$ to the destination, since the destination only requires the multiplication of $G_i$ and the transfer matrix of the $i^{th}$ batch to decode. A destination requires the degree $d_i$, the indices of the contributors, and the generator matrix $G_i$ for decoding. There are various methods that can realize this goal in previous art, e.g., the methods introduced for LT codes and Raptor codes. One preferred method is to share a pseudo-random generator between the source node and the destination nodes. The source node generates the degrees, the indices of the contributors, and the generator matrices all using this pseudo-random generator initialized by certain seed. The destination nodes can recover these information using its pseudo-random generator initialized by the same seed.

Figure 2:
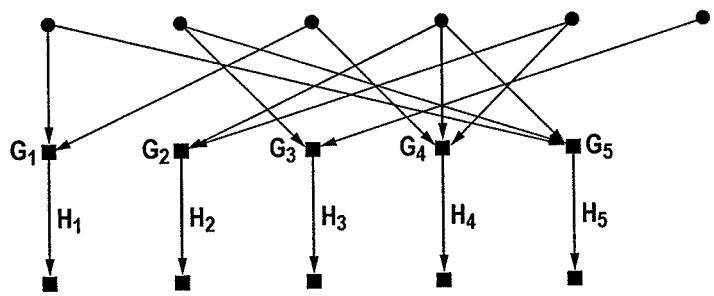
FIG. 2 is a bipartite Tanner graph illustrating the process of encoding according to the invention.

The encoding of sparse matrix codes can be described by bipartite Tanner graphs. The Tanner graph associated with a sparse matrix code is a bipartite graph. It has K variable nodes, corresponding to the input packets, and n check nodes, corresponding to the batches. Check node j is connected to variable node i if $b_i$ is the contributor of batch j. In FIG. 2, the top two layers of the graph illustrate the encoding procedure.

The encoding complexity of n batches is $O(TnM\Psi_{avg})$, where $\Psi_{avg}=\Sigma_{avg}d\Psi_d$. If $\Psi_{avg}$ is chosen to be a constant, the encoding complexity becomes linear with n. It is possible to design $\Psi$ with a constant $\Psi_{avg}$ which does not depend on K.

Transmission of Batches

Depending on the applications, there are many options to schedule the transmission of batches. For example, batches can be transmitted sequentially. To transmit a batch, the source node transmits the M packets in the batch. After the transmission of a batch, the source can generate and transmit another batch. No individual acknowledgement is required for each batch as acknowledgement is done on the whole data set.

The only requirement for the network is that the overall end-to-end transformation of the network for each batch is given by a linear function. The intermediate nodes can apply linear network coding. An intermediate node encodes the received packets of a batch into new packets using linear combinations and transmits these new packets on its outgoing links. These new packets are considered to be in the same batch. The packets in different batches are not mixed inside the network. Network topology dynamics and packet loss are allowed since the end-to-end network transformation remains linear.

Accordingly, the matrix formed by the received packets of the $i^{th}$ batch is:

$$Y_i=X_iH_i=B_iG_iH_i,$$

where $H_i$ is the transfer matrix of the $i^{th}$ batch determined by the network. In $H_i$, the number of rows is equal to M, while the number of columns may depend on i. The nodes in the bottom layer of FIG. 2 correspond to the received packets. Using the typical method of random linear network coding, the transfer matrix $H_i$ can be recovered from the packet headers of the coded packets.

Decoding

A destination tries to decode the input packets using the system of linear equations $Y_i=B_iG_iH_i$ with the knowledge of $G_iH_i$. The $i^{th}$ batch is decodable if $G_iH_i$ has rank $d_i$. Assume that the $i^{th}$ batch is decodable. Then the packets in $B_i$ can be recovered by solving the system of linear equations $Y_i=B_iG_iH_i$ which must have a unique solution. After decoding the batch, $d_i$ packets in $B_i$ are recovered. Then the values of these decoded input packets are substituted in the system of linear equations associated with the undecoded batches. Consider that $b_k$ is in $B_i$ and recovered. If $b_k$ is also involved in the $j^{th}$ batch, where j is not equal to i, then we decrease the degree of the $j^{th}$ batch, remove the row in $G_jH_j$ that corresponds to $b_k$, and remove the contribution of $b_k$ in $Y_j$.

Figure 3:
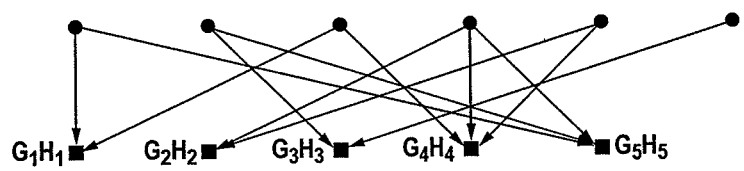
FIG. 3 is a bipartite Tanner graph illustrating the process of decoding according to the invention.

The decoding procedure can be better described using the bipartite graph in FIG. 3, which is the same with the encoding graph except that associated with each check node i is the system of linear equations $Y_i=B_iG_iH_i$. In the decoding graph, this is equivalent to first removing the $i^{th}$ check node, its neighboring variable nodes and the corresponding edges, and then for each removed variable node, updating the associated linear system of equations of its neighboring check nodes. This decoding-substitution procedure is repeated on the new graph until no more check nodes are decodable. When there are no more decodable batches, a destination node waits/requests for new batches and keeps on checking the decodability of new batches.

Such decoding has complexity $O(n\Sigma_d d^3 \Psi_d + Tn\Sigma_d d^2 \Psi_d)$, where n is the number of check nodes in the decoding graph.

Transmission Scheme Using Sparse Matrix Codes

Figure 4:
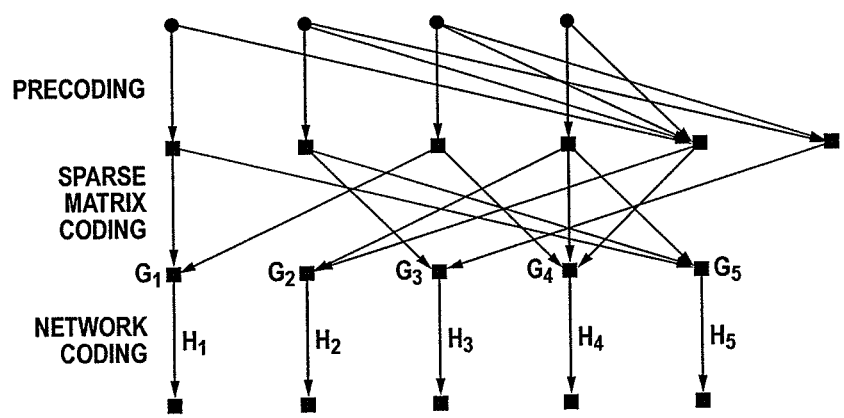
FIG. 4 is a chart illustrates a coding scheme where input packets are appended by redundant packets of a systematic pre-code.

According to the present invention, the input packets are optionally first encoded using a traditional erasure code (pre-coding), and then a proper sparse matrix code is applied to the pre-coded input packets. It is necessary that the belief propagation decoding described in the section on decoding recover a large fraction of the (pre-coded) input packets. (The original input packets can be recovered from the pre-code.) A pre-code is used as in Raptor codes, so reference is made to discussions elsewhere of such precoding. However, FIG. 4 illustrates such a coding scheme, where the input packets are appended by redundant packets in the case of a systematic pre-code. An appropriate sparse matrix code is used to generate output packets from the pre-coded input packets.

Degree Distributions

The degree distribution $\Psi$ must guarantee that: i) the decoding is successful with high probability, ii) the encoding and decoding complexity is low, and iii) the coding rate is large. The following is an example of how to find a desired degree distribution when the generator matrices are randomly chosen and the transfer matrices for batches are independently generated following the same distribution of H. In fact, many degree distributions will perform well, as small variations in the degree distribution may lead to only small changes in performance.

Denote $G_d$ the random matrix with d rows, M columns and uniformly independently distributed components over the finite field with q elements. The generator matrix of a batch with degree d is just an instance of $G_d$. Let $h_{d,r}$ be the probability that $G_dH$ has rank r. $h_{d,r}$ can be determined by the rank distribution of the transfer matrix, which is assumed to be known.

Let
$$\tilde{R}(x) = \sum_{r=1}^{M} \frac{1-q^{-1}}{1-q^{-r-1}} h_{r+1,r} \sum_{d=r+1}^{D} d\Psi_d I_{d-r,r}(x) + \sum_{r=1}^{M} r\Psi_r h_{r,r},$$

where
$$I_{a,b}(x) = \sum_{j=a}^{a+b-1} \binom{a+b-1}{j} x^j (1-x)^{a+b-1-j}$$

is called regularized incomplete beta function. The following optimization problem yields the desired degree distribution $$\max \theta$$
$$\text{s.t.} \quad \tilde{R}(x) + \theta \ln(1-x) \geq g(x), 0 < x < (1-\delta)$$
$$\Psi_d \geq 0, d = 1, \ldots, D$$
$$\sum_d \Psi_d = 1,$$

where $\delta > 0$ is a parameter that controls the fraction of input packets that can be decoded by the decoding algorithm above, $g(x)$ is some function of coding parameters. For example, we can take $g(x)=c/K$ for some constant $c$ when $K$ is small, or $g(x)=0$ when $K$ is large. In the optimization problem, $\theta$ is the design coding rate of the sparse matrix code and $D$ is the maximum degree. We can set $D$ to be the smallest integer larger or equal to $M/\delta$. This optimization can be approximately solved using linear programming by considering discrete values of $x$. For multiple destinations, the above design principle can be similarly applied by maximizing the smallest design coding rates of all destinations.

Figure 5:
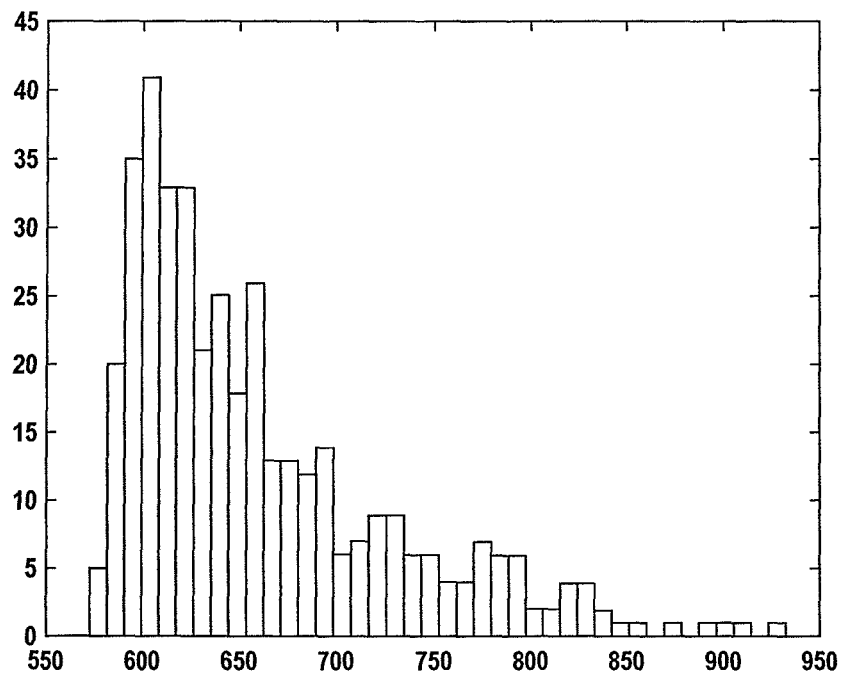
FIG. 5 is a histogram of the number of batches required to recover 92% of a set of input packets.
Figure 6:
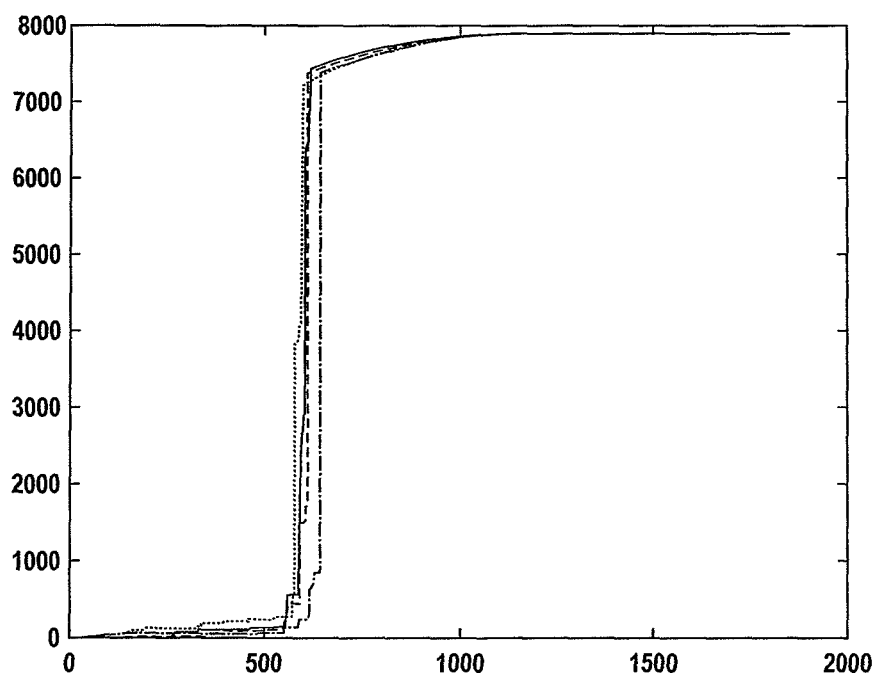
FIG. 6 is a graph showing number of input packets decoded as a function of the number of received batches.

Consider the example of a network with three nodes s, a and t linked together in series, much as on a single path in FIG. 1 from source to destination via an intermediate node. This network has three nodes: source node s, relay node a and sink node t. Data is sent from s to t via a. Assume the link can transmit one packet per unit time, and the packet loss rate is 0.1 on both links. FIG. 5 and FIG. 6 illustrate the practical performance of sparse matrix codes in such a network. For q=8 and M=16, the maximum achievable rate of this network is 0.8091.

Figure 7:
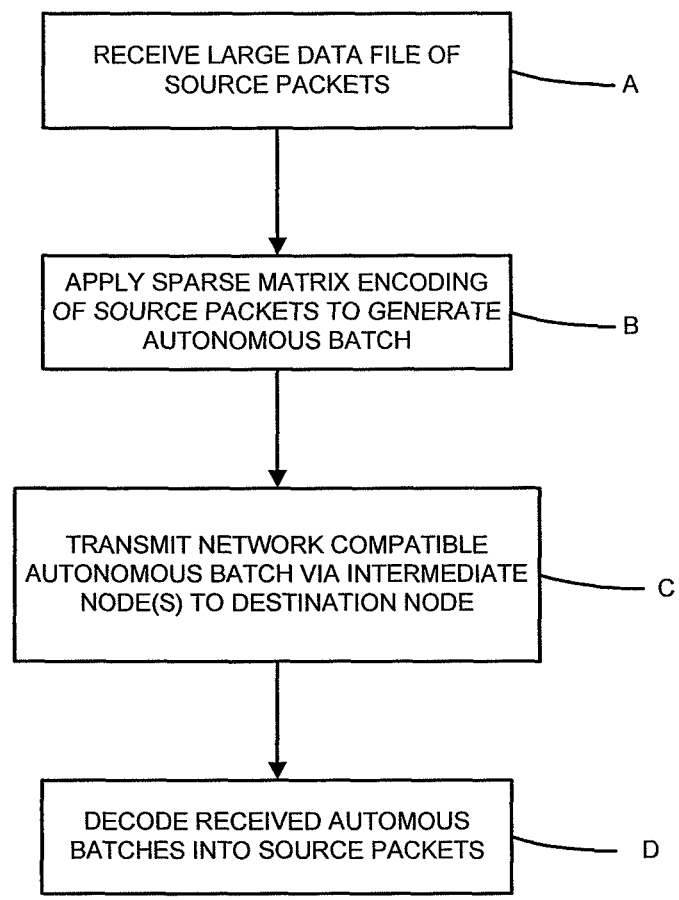
FIG. 7 is a flow chart for operations at a source node according to the invention.

Specific methods according to the invention are illustrated in FIGS. 7 through 10. Referring to FIG. 7, a method as employed at a source node is illustrated. The first or preliminary step is to receive the large data files of source packets (Step A), then to apply sparse matrix encoding to the source packets to generate the autonomous batches (Step B), then transmit the autonomous batches in a network compatible form via one or more intermediate nodes to a destination node (Step C). At the receiving node representations of the autonomous batches are received and decoded into representations, that is, reproductions of the source packets (Step D). A destination node does not need to send acknowledgement for each recovered batch. One benefit of subset coding is that such feedback can be eliminated. An acknowledgement may only be needed when the whole file or a pre-defined fraction of the file is recovered.

Figure 8:
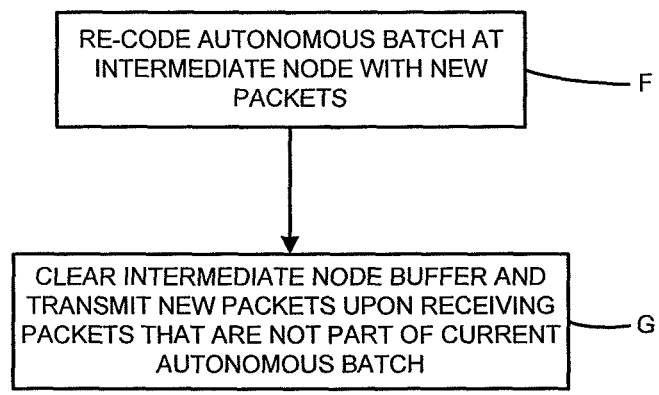
FIG. 8 is a flow chart for operations at one embodiment of an intermediate node according to the invention.

FIG. 8 depicts a process at a specific embodiment of an intermediate node. The intermediate node recodes the packets of an autonomous batch into what is herein termed "new packets (Step F). As soon as packets are received that do not belong to the current autonomous batch, the local buffer is cleared and the new packets are relayed or transmitted toward the destination node (Step G).

Figure 9:
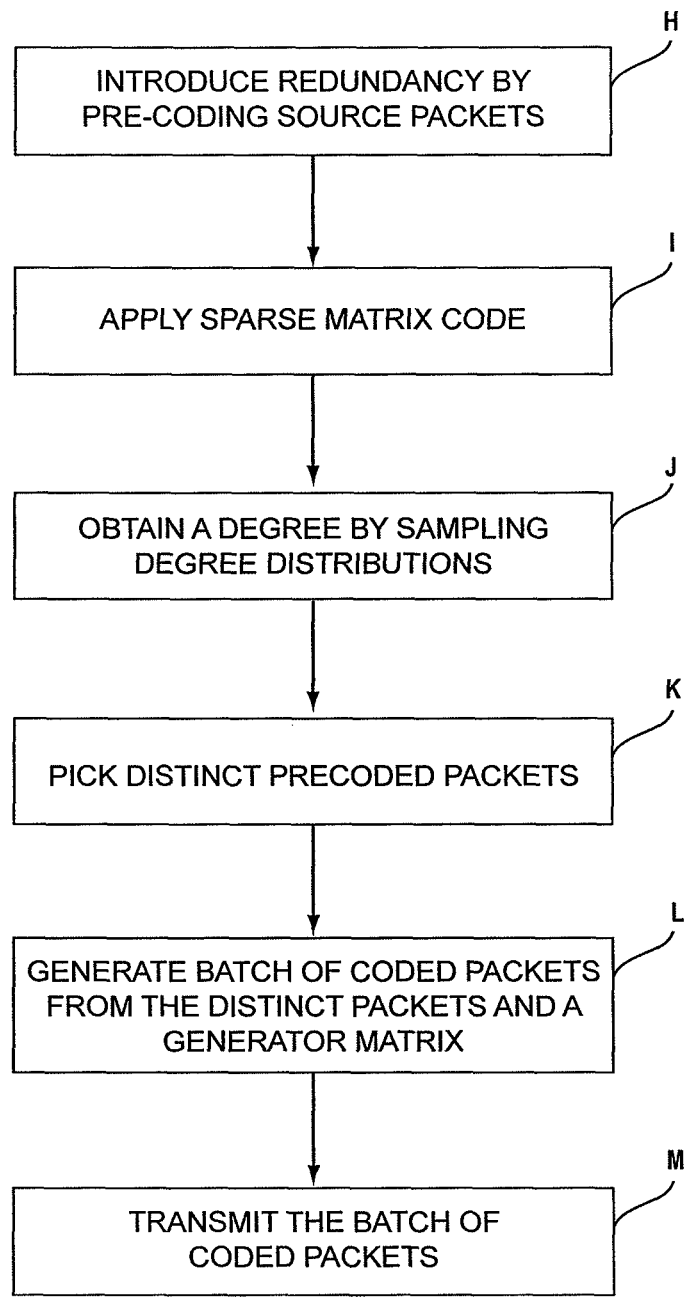
FIG. 9 is a flow chart for operations at a specific embodiment of a source node according to the invention.

FIG. 9 reflects a detail of a specific process at the source node. At the source node, redundancy is introduced by pre-coding the source packets with a pre-code (Step H). Thereafter is a sparse matrix coding step (Step I). A degree is then obtained by sampling degree distribution (Step J). Then distinct pre-coded packets are selected (Step K). Then a batch of coded packets is generated from the distinct packets and a generator matrix (Step L). It is this batch that is then transmitted (Step M).

Figure 10:
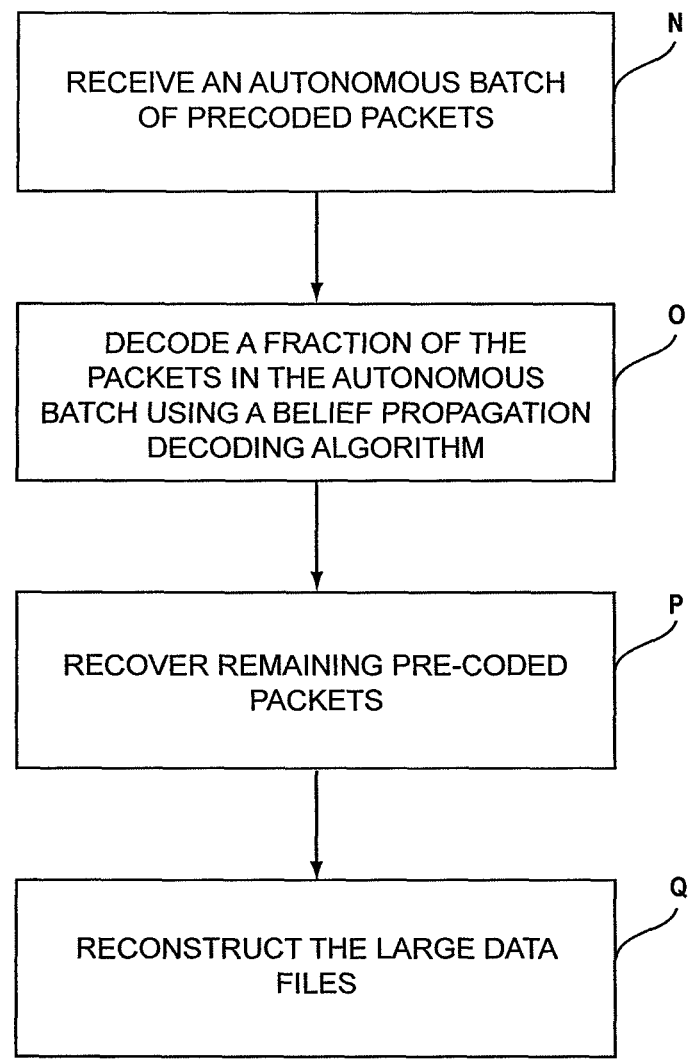
FIG. 10 is a flow chart for operations at a destination node according to the invention.

FIG. 10 is a flow chart of operation at a destination node. The node receives an autonomous batch that has been generated by the source node or recoded by intermediate nodes (Step N). It then decodes only a fraction of the pre-coded packets in the autonomous batch using a belief propagation decoding algorithm (Step O). Thereafter the remaining pre-coded packets are recovered (Step P) and the large data file or files is reconstructed (Step Q).

Figure 11:
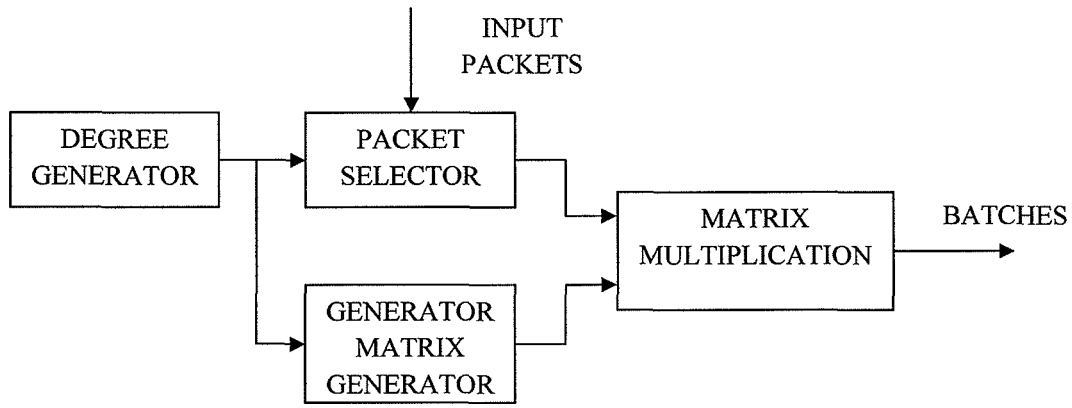
FIG. 11 is a block diagram of a sparse matrix code encoder according to one embodiment of the invention.

FIG. 11 is a block diagram of a sparse matrix code encoder embodied as a device in accordance with the invention as shown in FIG. 1. Input packets are received at a packet selector, such as from a precoder. A degree generator provides control/selection to the packet selector and a generator matrix generator, both of which provide input to a matrix multiplier the output of which is batches to the transmitter (FIG. 1).

Figure 12:
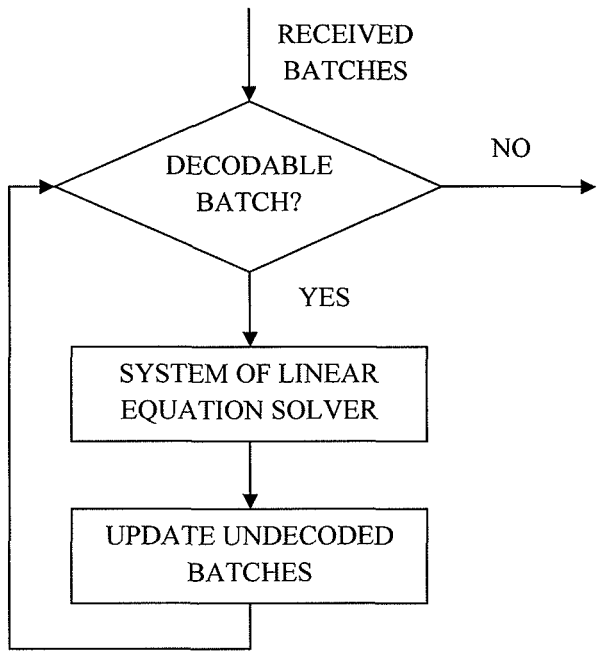
FIG. 12 is a flow chart for operations of a sparse matrix code decoder according to one embodiment of the invention.

FIG. 12 is a flow chart for a sparse matrix code decoder 54 (FIG. 1) of one embodiment of the invention. The batches received from receiver 52 (FIG. 1) are first tested to see if they are decodable, and if so, they are directed to a system of linear equation solver to extract data from the batches. The list of undecoded batches are then updated and any undecoded batches are retested for decidability and the process is repeated.

Figure 13:
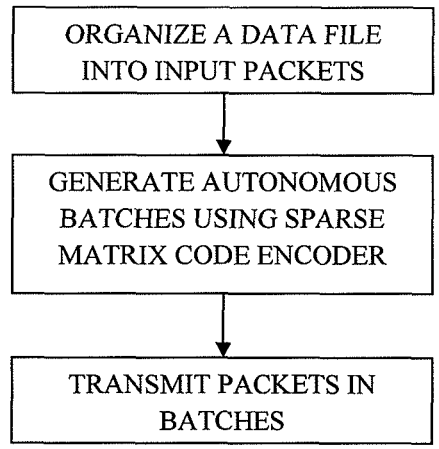
FIG. 13 is a flow chart for operations at a source node according to one embodiment of the invention.

FIG. 13 is a flow chart for operations at a source node 12 (FIG. 1) according to one embodiment of the invention. Data files are organized into packets, then the autonomous batches are generated according to the invention by sparse matrix codes. the packets are transmitted in batches.

Figure 14:
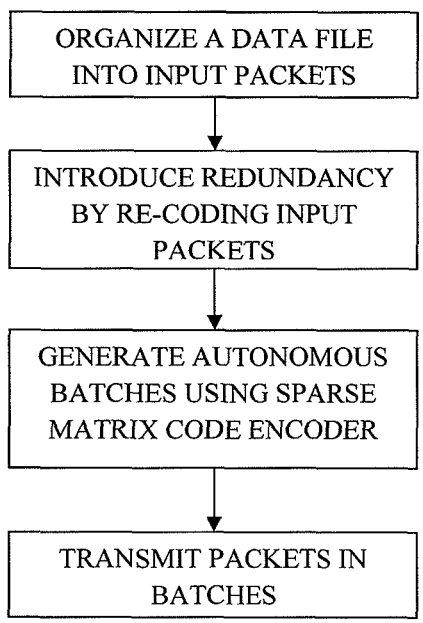
FIG. 14 is a flow chart for operations at a source node according to another embodiment of the invention.

FIG. 14 is a flow chart for operations at a source node according to another embodiment of the invention. In this embodiment the step of introducing redundancy is implemented prior to generating autonomous batches as before.

Figure 15:
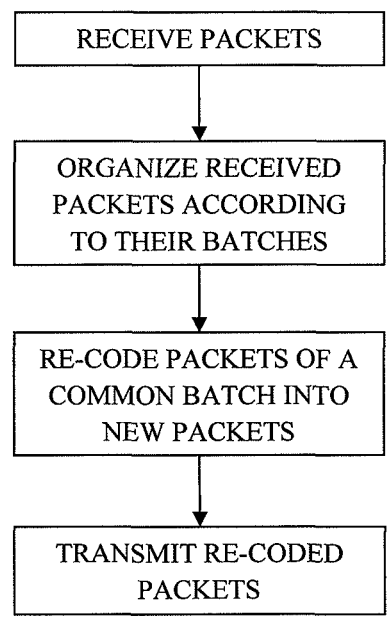
FIG. 15 is a flow chart for operations at an intermediate node according to one embodiment of the invention.

FIG. 15 is a flow chart for operations at an intermediate node according to one embodiment of the invention. The received packets are organized as received into their appropriate batches and the packets are re-coded into "new" packets containing the same batch data. Then the new packets are transmitted.

Figure 16:
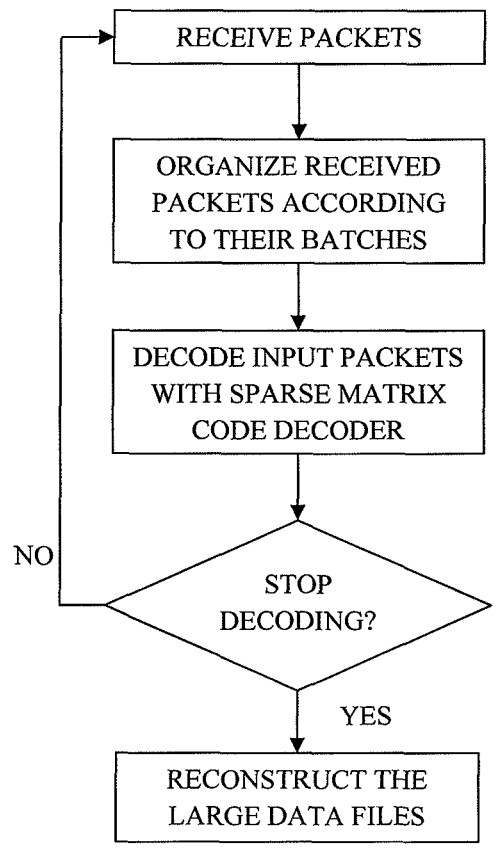
FIG. 16 is a flow chart for operations at a destination node according to one embodiment of the invention.

FIG. 16 is a flow chart for operations at a destination node according to one embodiment of the invention. Received packets as received in destination node 53 (FIG. 1) are organized according to their batches previously identified, then decoded using the sparse matrix decoder 54 (FIG. 1), until the data is exhausted. Once exhausted, reconstruction of large data files follows.

Figure 17:
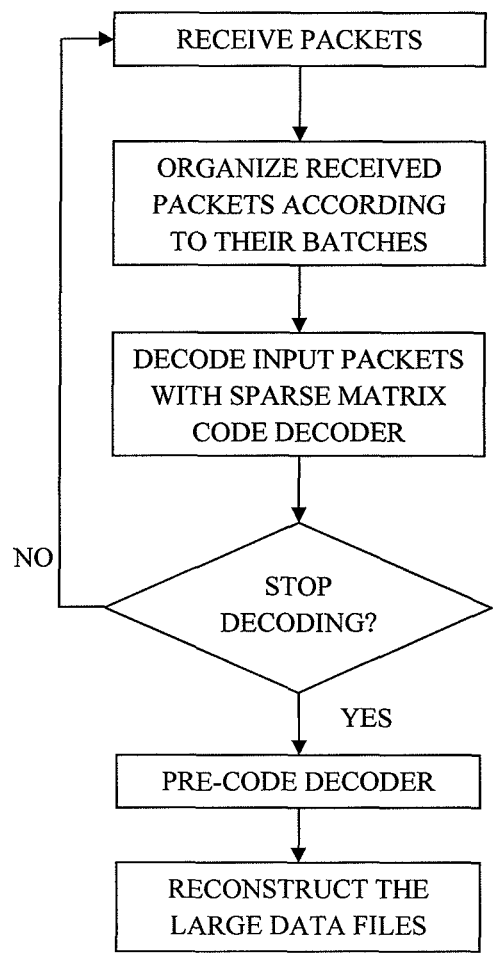
FIG. 17 is a flow chart for operations at a destination node according to another embodiment of the invention.

FIG. 17 is a flow chart for operations at a destination node according to another embodiment of the invention. the operation is similar to the procedure with respect to the flow chart of FIG. 16, except the decoder is pre-coded prior to reconstruction of the large data files.

Multicast

Sparse matrix codes are applicable for multicast, where more than one destination nodes demand a file transmitted by a source node. For multicast, the degree distribution must guarantee the successful decoding of all destination nodes. The optimal degree distribution can be obtained by maximizing the smallest coding rates as follows:

$$\max \min_{i \leq k} \theta_i$$
$$\text{s.t.} \quad \tilde{R}(x; H_i) + \theta_i \ln(1-x) \geq 0, \, i \leq k, \, 0 < x \leq 1 - \eta$$
$$\Psi_d \geq 0, \, d = 1, \ldots, D$$
$$\sum_d \Psi_d = 1,$$

where $H_i$ is the transfer matrix from the source node to the ith destination node.

Multiple Source Nodes

Consider a network with two source nodes and one destination node. Each source node has a copy of a single file to be transmitted to a destination node. These two source nodes encode the file using sparse matrix codes distributively, and the destination node decodes the batches it receives from both source nodes jointly, using sparse matrix code decoding.

Out of all the batches received, assume that $\lambda$ fraction are transmitted by the first source node, and $1-\lambda=\bar{\lambda}$ fraction are transmitted by the second source node. Let $\Psi(1)$ and $\Psi(2)$ be the degree distributions for the sparse matrix code encoding of the first and the second node respectively. The optimal degree distributions can be obtained by maximizing the coding rate as follows:

$$\max \theta$$
$$\text{s.t.} \quad \lambda \tilde{R}(x; \Psi(1), H(1)) + \bar{\lambda} \tilde{R}(x; \Psi(2), H(2)) + \theta \ln(1-x) \geq 0, \, 0 < x \leq 1 - \eta$$
$$\Psi_d(i) \geq 0, \, d = 1, \ldots, D, \, i = 1, 2$$
$$\sum_d \Psi_d(i) = 1 \; i = 1, 2,$$

where H(i) is the transfer matrix from the ith source node to the destination node.

Degenerated cases of the above optimization problem can also be used for various scenarios. To decouple the joint optimization, we can optimize $\Psi(i)$ by treating the ith source node as the only source node, i=1, 2. When we want both source nodes using the same degree distribution, we can set $\Psi=\Psi(1)=\Psi(2)$ in the above optimization.

The above discussion also applies to more than two source nodes. Sparse matrix codes for multiple source nodes can be used in peer-to-peer (P2P) file distribution as well as P2P streaming.

The invention has now been explained with reference to specific embodiments. Other embodiments will be evident to those of ordinary skill in the art. Therefore it is not intended that the invention be limited, except as indicated by the appended claims.

What is claimed is:

1. A method for processing packets in a telecommunication network comprising:

receiving representations of autonomous batches at a destination node, the autonomous batches having been encoded by a sparse matrix code applied to a large number of source packets composed of data files, the large number of source packets being pre-coded as output packets forming the autonomous packets;

decoding at the destination node the received representations of the autonomous batches using a belief propagation decoding algorithm of sparse matrix codes, the algorithm being operative to recover a fraction of all pre-coded source packets;

recovering at the destination node remaining pre-coded source packets; and reconstructing the data files from the recovered packets.

2. A system for transmitting and receiving large data files, the system comprising:

a source node having a sparse matrix coder for generating output packets in autonomous batches from a plurality of large data files; and a destination node having a decoder for autonomously reconstructing each large data file from received representations of the autonomous batches, the source node and the destination node being in communication through at least one intermediate node in a network, wherein the intermediate node does not recode the autonomous batches.

3. A system for transmitting and receiving large data files, the system comprising:

a source node having a sparse matrix coder for generating output packets in autonomous batches from a plurality of large data files; and a destination node having a decoder for autonomously reconstructing each large data file from received representations of the autonomous batches, the source node and the destination node being in communication through at least one intermediate node in a network, wherein the intermediate node is configured to recode the autonomous batches.

4. A method for transmitting large data files comprising:

receiving, at an encoder in a source node, data files, each data file comprising a large number of source packets;

applying, at the source node, a sparse matrix code to the source packets to generate output packets in autonomous batches, each of said output packets of the autonomous batches being of a selected degree derived from the sparse matrix code and generated by a generator matrix; and transmitting, from the source node, said autonomous batches in a network-compatible form via at least one intermediate node to a destination node, for decoding at the destination node to recover each said data file.

5. The method according to claim 4 further comprising:

before said transmitting step, separating the files to be transmitted into packets of equal length.

6. The method according to claim 4 further comprising:

receiving, at the source node from the destination node, a single acknowledgement for each data file.

7. The method according to claim 4 further comprising:

re-coding at the intermediate node, received and coded packets, the received and coded packets being part of a single one of the autonomous batches, to form a new packets batch;

receiving, at the intermediate node coded packets not belonging to said single one of the autonomous batches, whereupon causing the intermediate to transmit the new packets batch and clear a buffer containing said single one of the autonomous batches.

8. A method for transmitting large data files to multiple destination nodes, the method comprising:

encoding source packets at a source node using a pre-code to introduce redundancy to obtain pre-coded input packets;

encoding the pre-coded source packets at the source node using a sparse matrix code by the following steps:

1. obtaining a degree d by sampling a degree distribution;
2. picking d distinct pre-coded input packets;
3. generating an autonomous batch of coded packets using the current d packets and a generator matrix; thereafter
4. transmitting the current autonomous batch of packets to destination nodes; and repeating steps 1) through 4) at the source node(s) until the source node(s) receive(s) specific feedback from all or some destinations or until certain conditions are satisfied.

* * * * *